(12) United States Patent
Shiokawa et al.

(10) Patent No.: US 11,127,641 B2
(45) Date of Patent: Sep. 21, 2021

(54) SPIN-CURRENT MAGNETIZATION REVERSAL ELEMENT, MAGNETORESISTANCE EFFECT ELEMENT, AND MAGNETIC MEMORY

(71) Applicant: TDK CORPORATION, Tokyo (JP)

(72) Inventors: Yohei Shiokawa, Tokyo (JP); Tomoyuki Sasaki, Tokyo (JP); Tomomi Kawano, Tokyo (JP); Minoru Sanuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/311,546

(22) PCT Filed: Mar. 19, 2018

(86) PCT No.: PCT/JP2018/010794
§ 371 (c)(1),
(2) Date: Dec. 19, 2018

(87) PCT Pub. No.: WO2018/180701
PCT Pub. Date: Oct. 4, 2018

(65) Prior Publication Data
US 2019/0348329 A1   Nov. 14, 2019

(30) Foreign Application Priority Data
Mar. 29, 2017 (JP) .............................. JP2017-064871

(51) Int. Cl.
*H01L 29/82* (2006.01)
*H01L 21/8239* (2006.01)
(Continued)

(52) U.S. Cl.
CPC ........ *H01L 21/8239* (2013.01); *G11C 11/161* (2013.01); *G11C 11/18* (2013.01);
(Continued)

(58) Field of Classification Search
CPC .................... H01L 27/11502–11514; H01L 27/11585–11597; H01L 2924/1441;
(Continued)

(56) References Cited

U.S. PATENT DOCUMENTS 8,350,347 B2   1/2013 Gaudin et al.
2014/0056061 A1   2/2014 Khvalkovskiy et al.
(Continued)

FOREIGN PATENT DOCUMENTS

WO   2016/021468 A1   2/2016

OTHER PUBLICATIONS

May 22, 2018 International Search Report issued in International Patent Application PCT/JP2018/010794.
(Continued)

*Primary Examiner* — Tucker J Wright
(74) *Attorney, Agent, or Firm* — Oliff PLC (57) ABSTRACT

This spin current magnetization rotational element includes a first ferromagnetic metal layer for a magnetization direction to be changed, and a spin-orbit torque wiring extending in a second direction intersecting a first direction which is an orthogonal direction to a surface of the first ferromagnetic metal layer and configured to be joined to the first ferromagnetic metal layer, wherein the spin-orbit torque wiring has a structure in which a spin conduction layer joined to the first ferromagnetic metal layer and a spin generation layer joined to the spin conduction layer on a surface on a side opposite to the first ferromagnetic metal layer are laminated.

16 Claims, 3 Drawing Sheets

(51) Int. Cl.
| | | |
|---|---|---|
| *G11C 11/16* | (2006.01) | |
| *G11C 11/18* | (2006.01) | |
| *H01F 10/32* | (2006.01) | |
| *H01L 27/105* | (2006.01) | |
| *H01L 43/04* | (2006.01) | |
| *H01L 43/08* | (2006.01) | |
| *H01L 43/10* | (2006.01) | |

(52) U.S. Cl.
CPC ..... *H01F 10/3254* (2013.01); *H01F 10/3286* (2013.01); *H01L 27/105* (2013.01); *H01L 29/82* (2013.01); *H01L 43/04* (2013.01); *H01L 43/08* (2013.01); *H01L 43/10* (2013.01)

(58) Field of Classification Search
CPC ............. H01L 21/28291; H01L 29/516; H01L 29/6684; H01L 29/78391; H01L 28/40–92; H01L 27/222–228; H01L 43/02; H01L 43/10; H01L 43/12; H01L 29/82; G11C 11/22–2297; G11C 11/5657; G11C 14/0027; G11C 14/0072; G11C 11/14–1697; G11C 11/5607; G11C 14/0036; G11C 14/0045; G11C 14/0081; G11C 19/02–10; G11C 19/14; G11C 2211/5615–5616; H01F 10/324–3295; H01F 41/303

See application file for complete search history.

(56) References Cited

U.S. PATENT DOCUMENTS

| | | | |
|---|---|---|---|
| 2014/0225604 | A1 | 8/2014 | Mihajlovic et al. |
| 2015/0041934 | A1 | 2/2015 | Khvalkovskiy et al. |
| 2015/0348606 | A1 | 12/2015 | Buhrman et al. |
| 2016/0276006 | A1 | 9/2016 | Ralph et al. |
| 2017/0222135 | A1 | 8/2017 | Fukami et al. |
| 2018/0123028 | A1* | 5/2018 | Shiokawa ............... H01L 43/06 |
| 2019/0147929 | A1* | 5/2019 | Sasaki .................... H01L 43/02 365/158 |

OTHER PUBLICATIONS

S. Fukami et al; "A spin-orbit torque switching scheme with collinear magnetic easy axis and current configuration."; Nature Nanotechnology; Mar. 21, 2016; pp. 1-6.

J. Sinova et al; "Spin Hall effects"; Reviews of Modern Physics; vol. 87; Oct.-Dec. 2015; pp. 1213-1259.

Y.K. Kato et al; "Observation of the Spin Hall Effect in Semiconductors"; Science; vol. 306; Dec. 10, 2004; pp. 1910-1913; 5 pgs total.

Ioan M. Miron et al; "Perpendicular switching of a single ferromagnetic layer induced by in-plane current injection"; Nature; vol. 476; Aug. 11, 2011; pp. 189-194.

Luqiao Liu et al; "Spin torque switching with the giant spin Hall effect of tantalum"; Science; Mar. 13, 2012; 555; 32 pgs total.

Luqiao Liu et al; "Current-Induced Switching of Perpendicularly Magnetized Magnetic Layers Using Spin Torque from the Spin Hall Effect"; Physical Review Letters; 2012; vol. 109; pp. 096602-1-096602-5.

Ki-Seung Lee et al; "Threshold current for switching of a perpendicular magnetic layer induced by spin Hall effect"; Applied Physics Letters; 2013; vol. 102; 112410; 18 pgs total.

Ki-Seung Lee et al; "Thermally activated switching of perpendicular magnet by spin-orbit spin torque"; Applied Physics Letters; 2014; vol. 104; pp. 072413-1-072413-5; 6 pgs total.

Shunsuke Fukami et al; "Magnetization switching by spin-orbit torque in an antiferromagnet-ferromagnet bilayer system"; Nature Materials; Feb. 15, 2016; pp. 535-542.

S. Takahashi et al; "Spin injection and detection in magnetic nanostructures"; Physical Review B; 2003; vol. 67; pp. 052409-1-052409-4.

Yeongkyo Seo et al; "Area-Efficient SOT-MRAM With a Schottky Diode"; IEEE Electron Device Letters; vol. 37; No. 8; Aug. 2016; pp. 982-985.

W. Zhang et al; "Spin Hall Effects in Metallic Antiferromagnets"; Physical Review Letters; 2014; vol. 113; pp. 196602-1-196602-6.

Nov. 12, 2020 Extended European Search Report issued in European Patent Application No. 18775733.1.

* cited by examiner

SPIN-CURRENT MAGNETIZATION REVERSAL ELEMENT, MAGNETORESISTANCE EFFECT ELEMENT, AND MAGNETIC MEMORY

TECHNICAL FIELD

The present disclosure relates to a spin current magnetization rotational element, a magnetoresistance effect element, and a magnetic memory.

Priority is claimed on Japanese Patent Application No. 2017-064871 filed in Japan on Mar. 29, 2017, the content of which is incorporated herein by reference.

BACKGROUND ART

A giant magnetoresistive (GMR) element formed of a multilayer film including a ferromagnetic layer and a nonmagnetic layer, and a tunnel magnetoresistive (TMR) element in which an insulating layer (a tunnel barrier layer, a barrier layer) is used as a nonmagnetic layer are known. Generally, although a TMR element has a higher element resistance as compared with a GMR element, a magnetoresistance (MR) ratio of a TMR element is larger than an MR ratio of a GMR element. Therefore, attention has been focused on a TMR element as an element for magnetic sensors, high frequency components, magnetic heads, and non-volatile magnetoresistive random access memories (MRAMs).

In an MRAM, data is read and written by utilizing characteristics in which the element resistance of a TMR element changes as magnetization directions of two ferromagnetic layers sandwiching an insulating layer change. As a writing method of MRAMs, a method of performing writing (magnetization reversal) by utilizing a magnetic field generated by a current, and a method of performing writing (magnetization reversal) by utilizing a spin transfer torque (STT) generated by causing a current to flow in a lamination direction of a magnetoresistance effect element are known. Although the magnetization reversal of the TMR element using an STT is efficient when considered from the viewpoint of energy efficiency, a reversal current density for causing magnetization reversal is high. From the viewpoint of a long life span of the TMR element, it is preferable that the reverse current density be low. The same applies for GMR elements.

In recent years, attention has been focused on a magnetization reversal method in which a pure spin current generated by a spin Hall effect is utilized as a means for reducing the reversal current in a mechanism that is different from an STT (for example, see Non-Patent Literature 1). A pure spin current generated by the spin Hall effect induces a spin-orbit torque (SOT) and the SOT causes magnetization reversal to occur. The pure spin current is generated when the same number of upward spin electrons and downward spin electrons flow in opposite directions to each other, and thus flows of electric charge cancel out. Therefore, a current flowing through the magnetoresistance effect element is zero, and thereby realization of a magnetoresistance effect element with a small reversal current density can be expected.

According to Non-Patent Literature 1, it is reported that a reversal current density using the SOT method is approximately the same as a reversal current density using the STT method. However, the reversal current density reported in the present SOT method is insufficient for realizing high integration and low energy consumption. In order to further reduce the reversal current density, it is necessary to use a material that causes a high spin Hall effect to occur. Therefore, in addition to a spin Hall effect that occurs due to a bulk effect from a spin generation layer such as a layer made of a heavy metal, it is required to effectively produce both the spin Hall effect and an interface Rashba effect that occurs at an interface between different materials.

As a material used for a spin-orbit torque wiring (a wiring which induces an SOT to generate a pure spin current) of the magnetoresistance effect element in an SOT method, heavy metal materials such as Ta as used in Non-Patent Literature 1 can be exemplified. Since such heavy metal materials have a high electrical resistivity, high power consumption is also a problem when such heavy metal materials are used as a thin metal or a thin wire is used.

Further, in a spin-orbit torque wiring material that has been used so far, it has been difficult to achieve lattice matching with a ferromagnetic metal layer joined to the spin-orbit torque wiring.

CITATION LIST

Non-Patent Literature

[Non-Patent Literature 1]
 S. Fukami, T. Anekawa, C. Zhang, and H. Ohno, Nature Nanotechnology, DOI: 10.1038/NNANO.2016.29.
[Non-Patent Literature 2]
 J. Sinova, S. O. Valenzuela, J. Wunderlich, C. H. Back, T. Jungwirth, Reviews of Modern Physics, 87, 1213 (2015)

SUMMARY

The present disclosure has been made in view of the above-described problems, and it is an object of the present disclosure to propose a low-resistance spin-orbit torque wiring capable of effectively taking both a spin Hall effect and an interface Rashba effect while reducing power consumption.

The present inventors have taken particular note of an interface Rashba effect that occurs at an interface between different materials and a large spin Hall effect in heavy metal materials among various types of principle that can be considered as a cause of occurrence of an SOT, and have conceived of a configuration in which a low-resistance material is used while effectively combining both the effects. Therefore, the present disclosure provides the following means to solve the above problems.

(1) A spin current magnetization rotational element according to one aspect of the present disclosure includes a first ferromagnetic metal layer for a magnetization direction to be changed, and a spin-orbit torque wiring extending in a second direction intersecting a first direction which is an orthogonal direction to a surface of the first ferromagnetic metal layer and configured to be joined to the first ferromagnetic metal layer, wherein the spin-orbit torque wiring has a structure in which a spin conduction layer joined to the first ferromagnetic metal layer and a spin generation layer joined to the spin conduction layer on a surface on a side opposite to the first ferromagnetic metal layer are laminated.

(2) In the spin current magnetization rotational element according to (1) described above, a ratio $t_1/t_2$ of a film thickness $t_1$ of the spin conduction layer to a film thickness $t_2$ of the spin generation layer may be designed to be equal to or less than a ratio $\rho_1/\rho_2$ of a resistivity $\rho_1$ of the spin conduction layer to a resistivity $\rho_2$ of the spin generation layer.

(3) In the spin current magnetization rotational element according to (1) or (2) described above, the spin conduction layer may be formed of a material containing at least any one element of Al, Si, Cu, Ag, Ga, and Ge.

(4) In the spin current magnetization rotational element according to (1) or (2) described above, the spin conduction layer may have any one cubic crystal structure of NiAl, RuAl, RhAl, IrAl, and TiNi having symmetry of a space group Pm-3m, or any one cubic crystal structure of AlN, TaN, YBi, TiC, and TiN having symmetry of a space group Fm-3m.

(5) In the spin current magnetization rotational element according to any one of (1) to (4) described above, the spin generation layer may be formed of a material containing any one element of Mo, Ru, Rh, Pd, Ta, W, Ir, Pt, Au, and Bi.

(6) In the spin current magnetization rotational element according to any one of (1) to (5) described above, a thickness of the spin conduction layer may be a thickness equal to or less than a spin diffusion length of the spin conduction layer.

(7) In the spin current magnetization rotational element according to any one of (1) to (6) described above, a degree of lattice mismatching between the spin conduction layer and the first ferromagnetic metal layer may be within 5%.

(8) In the spin current magnetization rotational element according to any one of (1) to (7) described above, a thickness of the spin-orbit torque wiring may be equal to or less than 20 nm.

(9) In the spin current magnetization rotational element according to any one of (1) to (8) described above, a low-resistance electrode may be provided at both ends of the spin-orbit torque wiring, and a distance between the low-resistance electrode and a side surface of the first ferromagnetic metal layer facing each other may be equal to or less than the spin diffusion length of the spin conduction layer.

(10) A magnetoresistance effect element according to one aspect of the present disclosure includes the spin current magnetization rotational element according to any one of claims 1 to 9, a second ferromagnetic metal layer configured for a magnetization direction to be fixed, and a nonmagnetic material layer sandwiched between the first ferromagnetic metal layer and the second ferromagnetic metal layer.

(11) A magnetic memory according to one aspect of the present disclosure includes a plurality of magnetoresistance effect elements according to (10) described above.

According to the spin current magnetization rotational element of the present disclosure, both the spin Hall effect and the interface Rashba effect can be effectively produced while reducing power consumption.

DESCRIPTION OF EMBODIMENTS

Hereinafter, the present disclosure will be described in detail with reference to the drawings as appropriate. In the drawings used in the following description, there are cases in which characteristic portions are appropriately enlarged for convenience of illustration so that characteristics of the present disclosure can be easily understood, and dimensional proportions of respective constituent elements may be different from actual ones. Materials, dimensions, and the like illustrated in the following description are merely examples, and the present disclosure is not limited thereto and can be implemented with appropriate modifications within a range in which the effects of the present disclosure are achieved. In the elements of the present disclosure, other layers may be provided within a range of achieving effects of the present disclosure.

(Spin Current Magnetization Rotational Element)

Figure 1A:
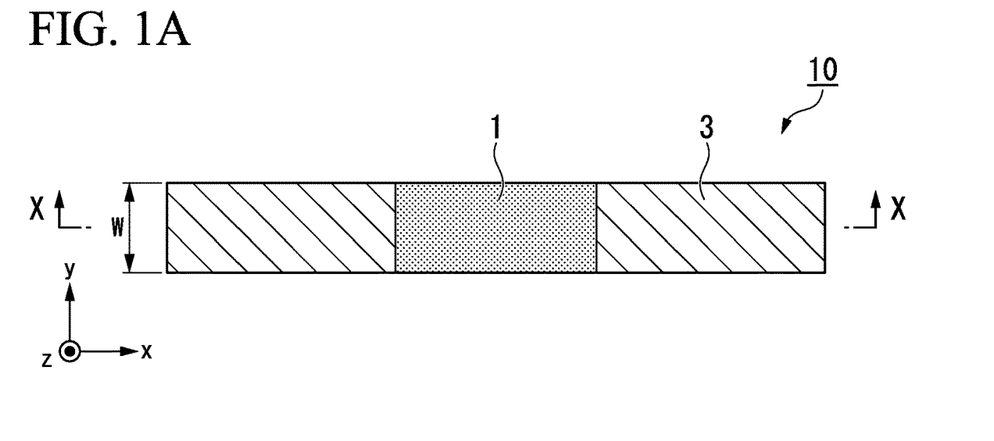
FIG. 1A is a schematic plan view for explaining a spin current magnetization rotational element according to one embodiment of the present invention.
Figure 1B:
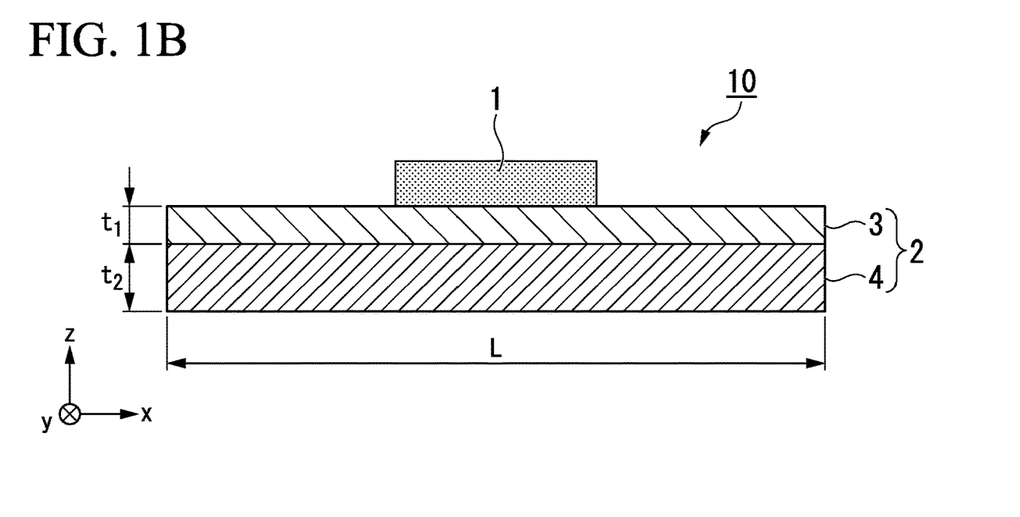
FIG. 1B is a schematic cross-sectional view for explaining the spin current magnetization rotational element according to one embodiment of the present invention.

FIGS. 1A and 1B illustrate schematic views of an example of a spin current magnetization rotational element according to one embodiment of the present disclosure. FIG. 1A is a plan view, and FIG. 1B is a cross-sectional view taken along line X-X which is a central line in a width direction of a spin conduction layer 3 of FIG. 1A.

A spin current magnetization rotational element 10 illustrated in FIGS. 1A and 1B includes a first ferromagnetic metal layer 1 in which a magnetization direction changes, and a spin-orbit torque wiring 2 extending in a second direction intersecting a first direction which is an orthogonal direction to a surface of the first ferromagnetic metal layer 1 and joined to the first ferromagnetic metal layer 1, in which the spin-orbit torque wiring 2 has a structure in which the spin conduction layer 3 joined to the first ferromagnetic metal layer 1, and a spin generation layer 4 joined to the spin conduction layer 3 on a surface on a side opposite to the first ferromagnetic metal layer 1 are laminated.

Hereinafter, an orthogonal direction to a surface of the first ferromagnetic metal layer 1 or a direction in which the first ferromagnetic metal layer 1 and the spin-orbit torque wiring 2 are laminated is a z direction (first direction), an orthogonal direction to the z direction and parallel to the spin-orbit torque wiring 2 is an x direction (second direction), and an orthogonal direction to the x direction and z direction is a y direction (third direction).

In the following description including FIGS. 1A and 1B, as an example of a configuration in which the spin-orbit torque wiring 2 extends in a direction intersecting the first direction which is the orthogonal direction to a surface of the first ferromagnetic metal layer 1, a configuration in which the spin-orbit torque wiring 2 extends in an orthogonal direction to the first direction will be described.

The spin current magnetization rotational element 10 of the present disclosure, that is, an element that performs magnetization reversal of a ferromagnetic metal layer using a spin-orbit torque (SOT) effect by a pure spin current can be used in a magnetoresistance effect element that performs magnetization reversal of a ferromagnetic metal layer using only an SOT using a pure spin current. On the other hand, the spin current magnetization rotational element of the present disclosure can be used as an assisting means or main means for magnetization reversal of a ferromagnetic metal layer in a magnetoresistance effect element using a conventional spin transfer torque (STT).

<First Ferromagnetic Metal Layer>

The first ferromagnetic metal layer 1 contains a known ferromagnetic material so that a magnetization direction changes. Further details of the first ferromagnetic metal layer 1 will be described in connection with a first ferromagnetic metal layer 101 in an application of a magnetoresistance effect element to be described below.

<Spin-Orbit Torque Wiring>

The spin-orbit torque wiring 2 is configured such that a pure spin current is generated when a current flows and a spin-orbit torque is induced. The spin-orbit torque wiring 2 of the present disclosure has a structure in which the spin conduction layers 3 and the spin generation layers 4 are laminated in the first direction.

At an interface between the spin conduction layers 3 and the spin generation layer 4, spin accumulation (a state in which either one of upward spins or downward spins is present in a large amount) due to an interface Rashba effect occurs. The spin accumulation causes a pure spin current to be generated.

Although a detailed mechanism of the interface Rashba effect is not clear, it is, however, thought to be as follows. At an interface between materials different from each other, spatial inversion symmetry is broken, and it is thought that a potential gradient is present in an orthogonal direction to a surface. When a current flows along the interface in which there is a potential gradient in such an orthogonal direction to the surface, that is, when electrons move in the two-dimensional surface, an effective magnetic field acts on spins in an orthogonal direction to a moving direction of the electrons and in an in-surface direction, and thus the spins align in a direction of the effective magnetic field. Thereby, spin accumulation is formed at the interface. Then, the spin accumulation causes a pure spin current that diffuses out of the surface to be generated.

In the present disclosure, a pure spin current is caused to be generated by utilizing a spin Hall effect that occurs in the spin-orbit torque wiring 2, particularly in the spin generation layer 4 in addition to the interface Rashba effect described above.

A spin Hall effect is a phenomenon in which a pure spin current is induced in an orthogonal direction to a current direction on the basis of spin-orbit interaction when a current flows in a material.

Figure 2:
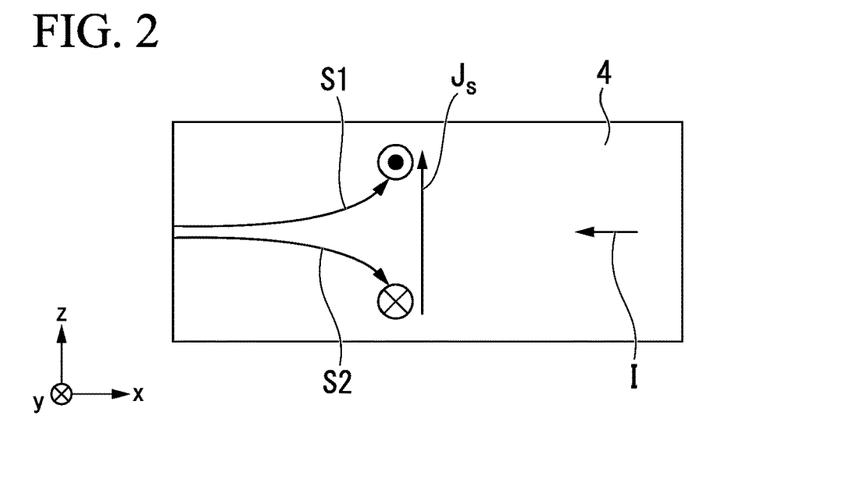
FIG. 2 is a schematic view for explaining a spin Hall effect.

FIG. 2 is a schematic view for explaining a spin Hall effect using the spin generation layer 4. FIG. 2 is a cross-sectional view taken along the x direction of the spin generation layer 4 illustrated in FIG. 1B. A mechanism in which a pure spin current is generated by the spin Hall effect will be described with reference to FIG. 2. Further, it should be noted that a spin Hall effect itself can occur not only in the spin generation layer 4 but also in the spin conduction layer 3. In this case, a spin Hall effect induced in the spin generation layer 4 can be made greater than a spin Hall effect induced in the spin conduction layer 3 by selection of a material or structure thereof.

As illustrated in FIG. 2, when a current I flows in an extending direction of the spin generation layer 4, a first spin S1 oriented to a side close to the paper surface and a second spin S2 oriented to a side far from the paper surface are respectively bent in an orthogonal direction to the current. A normal Hall effect and a spin Hall effect are the same in that electric charges (electrons) in a motion (movement) are bent in a direction of the motion (movement), but, while charged particles moving in a magnetic field are subjected to a Lorentz force and a direction of the motion is bent in the normal Hall effect, the spin Hall effect is greatly different in that, even though there is no magnetic field, when electrons merely move (when a current merely flows), a moving direction thereof is bent.

Since the number of electrons of the first spin S1 is equal to the number of electrons of the second spin S2 in a nonmagnetic material (a material which is not a ferromagnetic material), the number of electrons of the first spin S1 directed upward and the number of electrons of the second spin S2 directed downward in the drawing are the same. Therefore, the current as a net flow of electric charge is zero. Such a spin current that does not accompany a current is particularly called a pure spin current.

When a current is caused to flow through a ferromagnetic material, the fact that the first spin S1 and the second spin S2 are bent in opposite directions is the same. On the other hand, it is different in that inside the ferromagnetic material is in a state in which either the first spin S1 or the second spin S2 is greater than the other, and as a result, a net flow of electric charges occurs (a voltage is generated). Therefore, as a material of the spin generation layer 4, a material formed of only a ferromagnetic material is not included as described below, and particularly a nonmagnetic heavy metal material can be exemplified.

Here, when a flow of electrons in the first spin Si is expressed as $J\uparrow$, a flow of electrons in the second spin S2 is expressed as $J\downarrow$, and a spin current is expressed as $J_S$, it is defined by $J_S=J\uparrow-J\downarrow$. FIG. 2, the pure spin current $J_S$ flows upward in the drawing. Here, $J_S$ is a flow of electrons with a polarizability of 100%.

In FIG. 1B, when the first ferromagnetic metal layer 1, which is a ferromagnetic material, is brought into contact with an upper surface of the spin-orbit torque wiring 2, a pure spin current generated at the interface due to the interface Rashba effect and a pure spin current generated due to the spin Hall effect diffuse and are transmitted into the spin-orbit torque wiring 2, eventually reach the first ferromagnetic metal layer 1, and diffuse and flow into the first ferromagnetic metal layer 1. That is, spins are injected into the first ferromagnetic metal layer 1.

In the spin current magnetization rotational element 10 of the present disclosure, by having such a configuration in which a current is caused to flow through the spin-orbit torque wiring 2 to cause a pure spin current to be generated and the pure spin current diffuses into the first ferromagnetic metal layer 1 which is in contact with the spin-orbit torque wiring 2, magnetization reversal of the first ferromagnetic metal layer 1 occurs due to a spin-orbit torque (SOT) effect due to the pure spin current.

(Spin Conduction Layer)

In one embodiment, the spin conduction layer 3 is formed of a material having a low electrical resistivity to lower electrical resistance and a long spin diffusion length (a distance at which spin accumulation dissipates) to conduct a pure spin current to the first ferromagnetic metal layer 1. As a material forming the spin conduction layer, a material containing at least one element of Al, Si, Cu, Ag, Ga, and Ge can be exemplified. An elemental material may be used for the spin conduction layer 3, or a material in combination such as an alloy or a compound may be used for the spin conduction layer 3.

A thickness of the spin conduction layer 3 is preferably set to a thickness equal to or less than the spin diffusion length of the spin conduction layer 3. Thereby, it is possible to transmit a spin current to the first ferromagnetic metal layer 1 without losing spin information. A spin diffusion length depends particularly on a material used. For example, it is known that spin diffusion lengths of elemental Cu and elemental Ag reach 100 nm or more at room temperature. Referring to Non-Patent Literature 2, it is reported that a spin diffusion length of crystalline elemental Cu extends up to 500 µm at room temperature, and a spin diffusion length of crystalline elemental Ag extends up to 700 µm at room temperature. Therefore, the thickness of the spin conduction layer 3 can be set to be sufficiently equal to or less than the spin diffusion length. Further, as described in Non-Patent Literature 2, spin diffusion lengths of various types of material are known to those skilled in the art or can be estimated, and those skilled in the art need to note that the thickness of the spin conduction layer can be set to be equal to or less than the spin diffusion length in the case of using various types of materials based on the disclosure of the present disclosure.

Alternatively, in another embodiment, the spin conduction layer 3 may be formed of a material having any one cubic crystal structure of NiAl, RuAl, RhAl, IrAl, and TiNi having symmetry of a space group Pm-3m, or any one cubic crystal structure of AlN, TaN, YBi, TiC, and TiN having symmetry of a space group Fm-3m. In the crystal structure described above, even if the symmetry of a crystal is satisfactory, since reversal symmetry is lost due to a difference between two types of materials and spatial inversion symmetry is low, it is possible to cause a large spin-orbit interaction, that is, a large spin Hall effect to occur also in the spin conduction layer 3. Further, since a degree of lattice mismatching with the first ferromagnetic metal layer 1 (for example, Fe or the like) joined to the spin conductive layer 3 is 5% or less, materials having the above-described crystal structure can maintain a high magnetoresistance ratio. Here, a degree of lattice mismatching refers to an index of a matching state of two crystals at a crystal interface therebetween. When a degree of lattice mismatching is high, the crystals do not match each other and crystal lattices are distorted with respect to each other at the crystal interface. In general, when a degree of lattice mismatching is 5% or less, it is reported that, even if there is a crystal interface, epitaxial growth occurs corresponding to a crystal structure of an underlying layer with respect thereto.

Since the magnetoresistance ratio becomes higher as the lattice mismatching becomes lower, a preferably degree of lattice mismatching is 0% or more and 5% or less, and more preferably 0% or more and 3% or less, and still more preferably 0% or more and 2% or less.

(Spin Generation Layer)

Spin generation layer 4 is formed of a material that generates a large spin-orbit torque (SOT) due to a large spin Hall effect. As such a material, a nonmagnetic heavy metal such as a material containing at least one atomic element of Mo, Ru, Rh, Pd, Ta, W, Ir, Pt, Au, and Bi is an example, and an elemental material may be used for the spin generation layer 4, or a material in combination such as an alloy or a compound may be used for the spin generation layer 4.

Also for the spin generation layer 4, when a degree of lattice mismatching between the spin generation layer 4 and the spin conduction layer 3 joined to the spin generation layer 4 is 5% or less, another layer on one layer can be epitaxially grown.

Since the spin-orbit torque wiring 2 of the present disclosure has a two-layer structure of the spin conduction layer 3 and the spin generation layer 4 and the spin conduction layer 3 has a low electrical resistivity, power consumption can be reduced. However, in order to obtain an even larger SOT, it is desirable to cause a larger amount of current to flow through the spin generation layer 4. A larger amount of current flowing through the spin generation layer 4 can be achieved by appropriately designing thicknesses of the spin conduction layer 3 and the spin generation layer 4. Hereinafter, a design for the film thicknesses will be described below.

As illustrated in FIG. 1B, the spin conduction layer 3 has a width W, a length L, and a film thickness t1, and also has an electrical resistivity $\rho 1$. On the other hand, the spin generation layer 4 has the same width W and the same length L as the spin conduction layer 3, while having a film thickness t2 and an electrical resistivity $\rho 2$. Then, an electrical resistance R1 of the spin conduction layer 3 is expressed as R1=$\rho 1 \times$L/(W$\times$t1) (Expression 1) and an electrical resistance R2 of the spin generation layer 4 is expressed as R2=$\rho 2 \times$L/(W$\times$t2) (Expression 2).

When a voltage V is applied to both ends of the spin-orbit torque wiring 2 having the two-layer structure of the spin conduction layer 3 and the spin generation layer 4 in an extending direction, it can be considered that the spin conduction layer 3 and the spin generation layer 4 form a parallel circuit. Therefore, when a current flowing through the spin conduction layer 3 is $I_1$ and a current flowing through the spin generation layer 4 is $I_2$, a relation of $I_1 R_1 = I_2 R_2$ (=V) (Expression 3) can be obtained from Ohm's law for a parallel circuit. Therefore, from Expressions 1 to 3, the following Expression 4 can be obtained.

$$I_1/I_2 = R_2/R_1 = (\rho_2/\rho_1) \times (t_1/t_2)$$ (Expression 4)

Here, in the present disclosure, in order to cause a large amount of current to flow through the spin generation layer 4, it is necessary to satisfy a condition of $I_2 \geq I_1$ (Expression 5). Finally, from Expression 4 and Expression 5, the following Expression 6 can be obtained.

$$(t_1/t_2) \leq (\rho_1/\rho_2)$$ (Expression 6)

That is, in the present disclosure, the ratio $t_1/t_2$ of the film thickness $t_1$ of the spin conduction layer 3 to the film thickness $t_2$ of the spin generation layer 4 is designed to be equal to or less than the ratio $\rho_1/\rho_2$ of the resistivity $\rho_1$ of the spin conduction layer 3 to the resistivity $\rho_2$ of the spin generation layer 4. As a result, a larger amount of current can be caused to flow through the spin generation layer 4, and a larger SOT can be obtained.

As an example, when the spin conduction layer 3 is made of copper (Cu) (a resistivity of copper is 1.68$\times 10^8$ $\Omega$m at room temperature (20° C.)) and the spin generation layer 4 is made of tantalum (Ta) (a resistivity of tantalum is 1.31$\times 10^7$ $\Omega$m at room temperature (20° C.)), a ratio between the film thicknesses is designed to be $t_1/t_2 \leq$about 0.13.

More preferably, the thickness of the spin conduction layer 3 and the thickness of the spin generation layer 4 are set such that a thickness of the spin-orbit torque wiring 2, which is a laminate of these two layers, is 20 nm or less. When the thickness of the spin-orbit torque wiring 2 is more than 20 nm and becomes excessively thick, since a surface roughness between the spin-orbit torque wiring 2 and the first ferromagnetic metal layer 1 laminated thereon is increased, there is a likelihood that a magnetoresistive effect will become unstable.

A lower limit value of the thickness of the spin-orbit torque wiring 2 is preferably 1 nm, and the thickness of the spin-orbit torque wiring 2 is more preferably 2 nm to 10 nm.

Figure 3A:
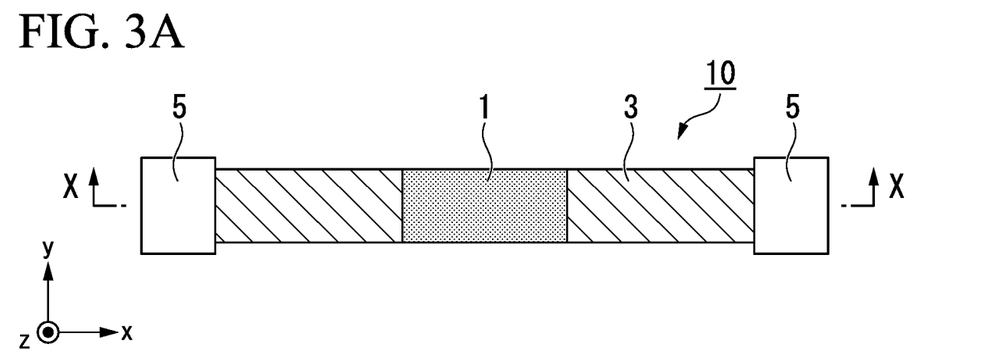
FIG. 3A is a schematic plan view for explaining a spin current magnetization rotational element according to another embodiment of the present invention.
Figure 3B:
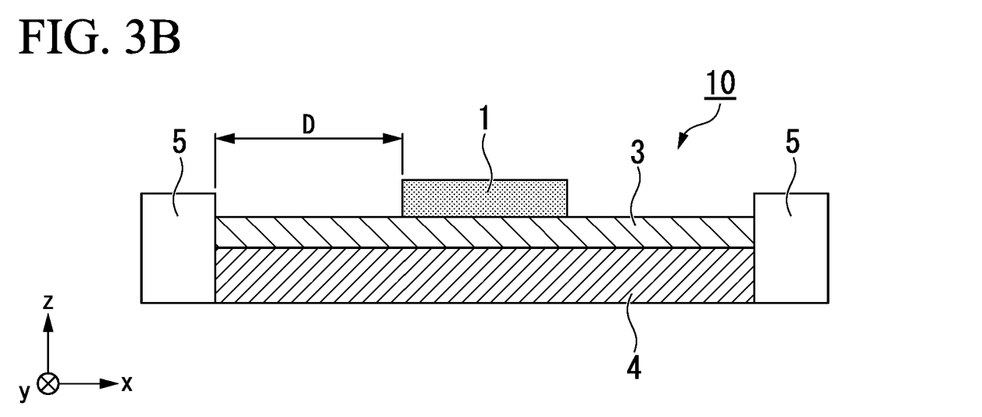
FIG. 3B is a schematic cross-sectional view for explaining the spin current magnetization rotational element according to another embodiment of the present invention.

FIGS. 3A and 3B illustrate schematic views of an example of a spin current magnetization rotational element according to another embodiment of the present disclosure. FIG. 3A is a plan view, and FIG. 3B is a cross-sectional view taken along line X-X which is a central line in a width direction of a spin conduction layer 3 of FIG. 3A.

In the embodiment of the present disclosure illustrated in FIGS. 3A and 3B, a spin current magnetization rotational element 10 further includes a low-resistance electrode 5. Other constituents are the same as those of the embodiment of the present disclosure illustrated in FIGS. 1A and 1B, and description thereof will be omitted.

Although reference signs are not illustrated in FIG. 3B, as in FIG. 1B, a spin-orbit torque wiring 2 is configured as a structure in which the spin conduction layer 3 joined to a first ferromagnetic metal layer 1 and a spin generation layer 4 joined to the spin conduction layer 3 on a surface on a side opposite to the first ferromagnetic metal layer 1 are laminated.

The low-resistance electrodes 5 are respectively joined to both ends of the spin-orbit torque wiring 2. A material having high conductivity, for example, aluminum, silver, copper, gold, or the like can be used for the low-resistance electrode 5. A distance D between the low-resistance electrode 5 and a side surface of the first ferromagnetic metal layer 1 facing each other is designed to be equal to or less than a spin diffusion length of the spin conduction layer 3, and is preferably designed to be equal to the spin diffusion length. Here, as illustrated in FIG. 3B, the distance D between the low-resistance electrode 5 and the side surface of the first ferromagnetic metal layer 1 facing each other is referred to as a perpendicular distance between a plane including a side surface of the low-resistance electrode 5 and a plane including the side surface of the first ferromagnetic metal layer 1 facing each other. Thereby, a pure spin current generated due to the spin Hall effect in a portion of the spin generation layer 4 other than a portion under the first ferromagnetic metal layer 1 and a pure spin current generated due to the interface Rashba effect at an interface between the spin conduction layer 3 and the spin generation layer 4 other than the portion under the first ferromagnetic metal layer 1 can be caused to reach the first ferromagnetic metal layer 1 via the spin conduction layer 3 to the maximum extent possible.

An insulating layer joined to a surface of the spin-orbit torque wiring 2 on a side opposite to a surface to which the first ferromagnetic metal layer 1 is joined can be further provided. When this configuration is applied to magnetoresistance effect elements or other applications, it is possible to prevent a current flowing in the spin-orbit torque wiring from leaking from the surface on a side opposite to the surface to which the first ferromagnetic metal layer 1 is joined, and thereby a current concentration effect can be further enhanced.

In the above-described embodiment, a case in which the spin-orbit torque wiring is directly connected to the first ferromagnetic metal layer has been described, but another layer such as a cap layer may be interposed between the first ferromagnetic metal layer and the spin-orbit torque wiring as described below. Further details of the cap layer will be described in connection with a cap layer 104 in an application of the magnetoresistance effect element to be described below.

The spin current magnetization rotational element of the present disclosure can be applied to magnetoresistance effect elements as described below. The present disclosure is not limited to magnetoresistance effect elements, and can be applied in other applications. As another application, for example, the above-described spin current magnetization rotational element can be arranged at each pixel to be used in a spatial light modulator in which incident light is spatially modulated using a magneto-optical effect, and a magnetic field applied to an axis of easy magnetization of a magnet may be replaced by an SOT in order to avoid a hysteresis effect due to a coercivity of a magnet in a magnetic sensor.

(Magnetoresistance Effect Element)

A magnetoresistance effect element according to one embodiment of the present disclosure includes a spin current magnetization rotational element of the present disclosure, a second ferromagnetic metal layer configured for a magnetization direction to be fixed, and a nonmagnetic layer sandwiched between the first ferromagnetic metal layer and the second ferromagnetic metal layer.

Figure 4:
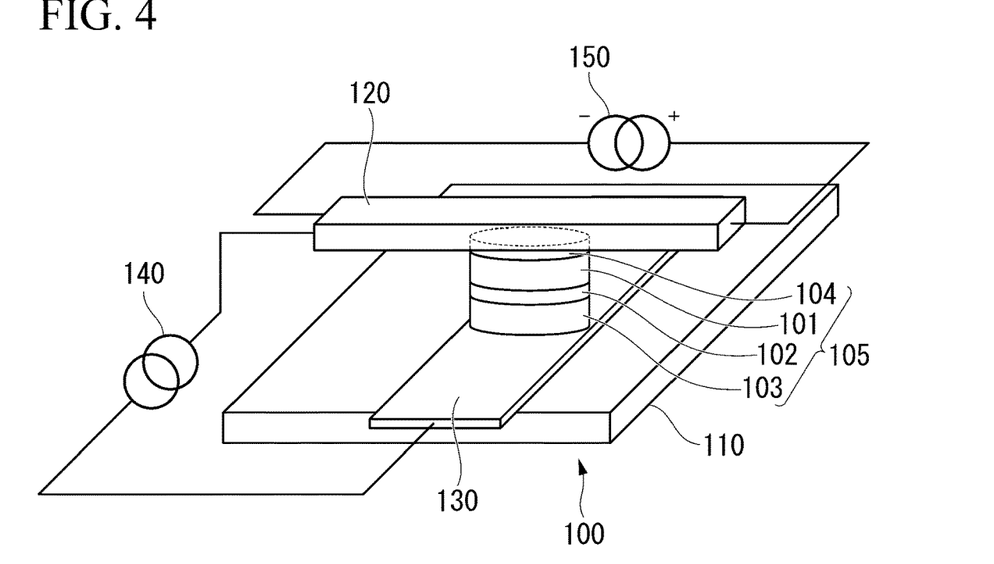
FIG. 4 is a perspective view schematically illustrating a magnetoresistance effect element according to one embodiment of the present invention.

FIG. 4 is an example of application of the spin current magnetization rotational element of the present disclosure, and also is a perspective view schematically illustrating a magnetoresistance effect element which is also the magnetoresistance effect element according to one embodiment of the present disclosure. Further, in FIG. 4, illustration of a characteristic portion of the spin current magnetization rotational element of the present disclosure is omitted.

A magnetoresistance effect element 100 illustrated in FIG. 4 includes a spin current magnetization rotational element (a first ferromagnetic metal layer 101 and a spin-orbit torque wiring 120) of the present disclosure, a second ferromagnetic metal layer 103 configured for a magnetization direction to be fixed, and a nonmagnetic layer 102 sandwiched between the first ferromagnetic metal layer 101 and the second ferromagnetic metal layer 103. The first ferromagnetic metal layer 101 has the same configuration as the above-described first ferromagnetic metal layer 1, and the spin-orbit torque wiring 120 has the same configuration as the above-described spin-orbit torque wiring 2. Further, the magnetoresistance effect element 100 illustrated in FIG. 4 can also be referred to as having a magnetoresistance effect element portion 105 and the spin-orbit torque wiring 120.

Since the magnetoresistance effect element according to one embodiment of the present disclosure includes the spin-orbit torque wiring 120, it is possible to have a configuration in which magnetization reversal of the magnetoresistance effect element is performed using only an SOT using a pure spin current (hereinafter, may be referred to as a "SOT only" configuration), and it is also possible to have a configuration in which the SOT using a pure spin current is used in combination in a conventional magnetoresistance effect element using an STT.

In the following description including FIG. 4, as an example of a configuration in which the spin-orbit torque wiring extends in a direction intersecting a lamination direction of the magnetoresistance effect element portion, a case in which the spin-orbit torque wiring is configured to extend in an orthogonal direction to the lamination direction of the magnetoresistance effect element portion will be described.

A wiring 130 for causing a current to flow in the lamination direction of the magnetoresistance effect element 100 and a substrate 110 for forming the wiring 130 are also illustrated in FIG. 4. The cap layer 104 is provided between the first ferromagnetic metal layer 101 and the spin-orbit torque wiring 120.

<Magnetoresistance Effect Element Portion>

The magnetoresistance effect element portion 105 includes a second ferromagnetic metal layer 103 configured for a magnetization direction to be fixed, a first ferromagnetic metal layer 101 in which a magnetization direction changes, and the nonmagnetic layer 102 sandwiched between the second ferromagnetic metal layer 103 and the first ferromagnetic metal layer 101.

The magnetization of the second ferromagnetic metal layer 103 is fixed in one direction, a direction of magnetization of the first ferromagnetic metal layer 101 changes relatively, and thereby the magnetoresistance effect element portion 105 functions as a magnetoresistance effect element. When it is applied to a coercivity-differed type (pseudo spin valve type) magnetic random access memory (MRAM), a coercivity of the second ferromagnetic metal layer 103 is larger than a coercivity of the first ferromagnetic metal layer 101, and when it is applied to an exchange bias type (spin valve type) MRAM, a direction of magnetization in the second ferromagnetic metal layer 103 is fixed due to exchange coupling with an antiferromagnetic layer.

Also, when the nonmagnetic layer 102 is formed of an insulator, the magnetoresistance effect element portion 105 is a tunneling magnetoresistance (TMR) element, and when the nonmagnetic layer 102 is formed of a metal, the magnetoresistance effect element portion 105 is a giant magnetoresistance (GMR) element.

For the magnetoresistance effect element portion 105 provided in the present embodiment, a configuration of a known magnetoresistance effect element portion can be employed. For example, each layer may be formed of a plurality of layers, or another layer such as an antiferromagnetic layer for fixing a direction of magnetization of the second ferromagnetic metal layer 103 may be provided.

The second ferromagnetic metal layer 103 is called a fixed layer, a pin layer, a reference layer, or the like, and the first ferromagnetic metal layer 101 is called a free layer, a free layer, a storage layer, or the like.

The second ferromagnetic metal layer 103 and the first ferromagnetic metal layer 101 may be either an in-surface magnetization film of which a magnetization direction is an in-surface direction parallel to the layer, or a perpendicular magnetization film of which a magnetization direction is an orthogonal direction to the layer.

For a material of the second ferromagnetic metal layer 103, a known material can be used. For example, a metal selected from a group consisting of Cr, Mn, Co, Fe and Ni, and an alloy containing one or more of these metals and exhibiting ferromagnetism can be used. It is also possible to use an alloy containing these metals and at least one of the elements B, C, and N. Specifically, Co—Fe and Co—Fe—B can be exemplified.

Also, in order to obtain a higher output, it is preferable to use a Heusler alloy such as $Co_2FeSi$. A Heusler alloy contains an intermetallic compound having a chemical composition of $X_2YZ$, in which X indicates a transition metal element from the Co, Fe, Ni, or Cu groups, or a noble metal element in the Periodic Table, Y indicates a transition metal from the Mn, V, Cr, or Ti groups, or an element from the groups for X, and Z indicates a typical element from Group III to Group V. For example, $Co_2FeSi$, $Co_2MnSi$, $Co_2Mn_{1-a}Fe_aAl_bSi_{1-b}$, or the like can be exemplified.

Also, in order to further increase a coercivity of the second ferromagnetic metal layer 103 with respect to the first ferromagnetic metal layer 101, an antiferromagnetic material layer such as IrMn, PtMn, or the like may be used on a surface of the second ferromagnetic metal layer 103 on a side opposite to a surface with which the nonmagnetic layer 102 is in contact as a layer (a pinning layer) in contact with the second ferromagnetic metal layer 103. Further, in order to prevent a leakage magnetic field of the second ferromagnetic metal layer 103 from affecting the first ferromagnetic metal layer 101, a synthetic ferromagnetic coupling structure may also be employed.

In addition, when a direction of magnetization of the second ferromagnetic metal layer 103 is made perpendicular to a lamination surface, it is preferable to use a film in which Co and Pt are laminated. Specifically, the second ferromagnetic metal layer 103 can be formed of [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm).

As a material of the first ferromagnetic metal layer 101, a ferromagnetic material, particularly a soft magnetic material, can be applied. For example, a metal selected from the group consisting of Cr, Mn, Co, Fe and Ni, an alloy containing one or more of these metals, and an alloy containing these metals and at least one of the elements B, C, and N, or the like can be used. Specifically, Co—Fe, Co—Fe—B, and Ni—Fe can be exemplified.

When a direction of magnetization of the first ferromagnetic metal layer 101 is made perpendicular to the lamination surface, the first ferromagnetic metal layer is preferably formed to have a thickness of 2.5 nm or less. Thereby, perpendicular magnetic anisotropy can be added to the first ferromagnetic metal layer 101 at an interface between the first ferromagnetic metal layer 101 and the nonmagnetic layer 102. Also, since an effect of the perpendicular magnetic anisotropy is attenuated when the film thicknesses of the first ferromagnetic metal layer 101 increases, it is preferable that the film thickness of the first ferromagnetic metal layer 101 be small.

For the nonmagnetic layer 102, a known material can be used. For example, when the nonmagnetic layer 102 is formed of an insulator (that is, in a case of a tunnel barrier layer), $Al_2O_3$, $SiO_2$, Mg, $MgAl_2O_4$, or the like can be used as the material. In addition to these materials, a material in which some of Al, Si, and Mg is substituted with Zn, Be or the like can also be used. Of these, since MgO and $MgAl_2O_4$ are materials that can realize coherent tunneling, spin can be efficiently injected. Further, when the nonmagnetic layer 102 is formed of a metal, Cu, Au, Ag, or the like can be used as the material.

Also, it is preferable that the cap layer 104 be formed on a surface of the first ferromagnetic metal layer 101 on a side opposite to the nonmagnetic layer 102 as illustrated in FIG. 4. The cap layer 104 can inhibit diffusion of elements from the first ferromagnetic metal layer 101. The cap layer 104 also contributes to crystal orientation of each layer of the magnetoresistance effect element portion 105. As a result, by providing the cap layer 104, magnetism of the second ferromagnetic metal layer 103 and the first ferromagnetic metal layer 101 of the magnetoresistance effect element portion 105 is stabilized, and resistance of the magnetoresistance effect element portion 105 can be lowered.

For the cap layer 104, it is preferable to use a material having high conductivity. For example, Ru, Ta, Cu, Ag, Au, Mg, Al, or the like can be used. It is preferable that a crystal structure of the cap layer 104 be appropriately set using a face-centered cubic (fcc) structure, a hexagonal close-packed (hcp) structure, or a body-centered cubic (bcc) structure in accordance with a crystal structure of the adjacent ferromagnetic metal layer.

Also, it is preferable to use any one selected from a group consisting of Ag, Cu, Mg, and Al for the cap layer 104. As will be described in detail below, when the spin-orbit torque wiring 120 and the magnetoresistance effect element portion 105 are connected to each other via the cap layer 104, it is preferable that the cap layer 104 does not dissipate spin transferred from the spin-orbit torque wiring 120. It is known that silver, copper, magnesium, aluminum, and the like have a long spin diffusion length of 100 nm or more, and do not easily dissipate spin.

A thickness of the cap layer 104 is preferably equal to or less than a spin diffusion length of a material forming the cap layer 104. When the thickness of the cap layer 104 is equal to or less than the spin diffusion length, the spin transferred from the spin-orbit torque wiring 120 can be sufficiently transferred to the magnetoresistance effect element portion 105.

<Substrate>

The substrate 110 is preferably highly flat. In order to obtain a highly flat surface, for example, Si, AlTiC, or the like can be used as a material thereof.

An underlayer (not illustrated) may be formed on a surface of the substrate 110 on the magnetoresistance effect element portion 105 side. When the underlayer is provided, it is possible to control crystalline properties of each layer including the second ferromagnetic metal layer 103 laminated on the substrate 110 such as crystal orientation, crystal grain size, or the like.

It is preferable that the underlayer have insulation properties. This is to prevent dissipation of a current flowing through the wiring 130 or the like. Various materials can be used for the underlayer. For example, as one example, a nitride layer having a (001)-oriented NaCl structure and containing at least one element selected from a group of Ti, Zr, Nb, V, Hf, Ta, Mo, W, B, Al, and Ce can be used for the underlayer.

As another example, a layer of a (002)-oriented perovskite-based conductive oxide expressed by a composition formula $XYO_3$ can be used for the underlayer. Here, the sites X contain at least one element selected from a group of Sr, Ce, Dy, La, K, Ca, Na, Pb, and Ba, and the sites Y contain at least one element selected from a group of Ti, V, Cr, Mn, Fe, Co, Ni, Ga, Nb, Mo, Ru, Ir, Ta, Ce, and Pb.

As another example, an oxide layer having a (001)-oriented NaCl structure and containing at least one element selected from a group of Mg, Al, and Ce can be used for the underlayer.

As another example, a layer having a (001)-oriented crystal structure or a cubic crystal structure and containing at least one element selected from a group of Al, Cr, Fe, Co, Rh, Pd, Ag, Ir, Pt, Au, Mo, and W can be used for the underlayer.

Further, the underlayer is not limited to one layer, and may have a plurality of layers in which layers of the above-described examples are laminated. By devising a structure of the underlayer, crystalline properties of each layer of the magnetoresistance effect element portion 105 can be enhanced, and magnetic characteristics can be improved.

<Wiring>

The wiring 130 is electrically connected to the second ferromagnetic metal layer 103 of the magnetoresistance effect element portion 105 so that the wiring 130, the spin-orbit torque wiring 120, and a power supply (not illustrated) form a closed circuit in FIG. 4 to cause a current to flow in the lamination direction of the magnetoresistance effect element portion 105.

The wiring 130 is not particularly limited as long as it is of a highly conductive material. For example, aluminum, silver, copper, gold, or the like can be used.

In the above-described embodiment, although a so-called bottom pin structure in which the first ferromagnetic metal layer 101 that is laminated later and disposed on a side far from the substrate 110 is a magnetization free layer, and the second ferromagnetic metal layer 103 that is laminated first and disposed on a side close to the substrate 110 is a magnetization fixed layer (pin layer) in the magnetoresistance effect element 100 has been exemplified, the structure of the magnetoresistance effect element 100 is not particularly limited, and may be a so-called top pin structure.

<Power Supply>

The magnetoresistance effect element 100 further includes a first power supply 140 which causes a current to flow in the lamination direction of the magnetoresistance effect element portion 105, and a second power supply 150 which causes a current to flow through the spin-orbit torque wiring 120.

The first power supply 140 is connected to the wiring 130 and the spin-orbit torque wiring 120. The first power supply 140 can control a current flowing in the lamination direction of the magnetoresistance effect element 100.

The second power supply 150 is connected to both ends of the spin-orbit torque wiring 120. The second power supply 150 can control a current flowing in the spin-orbit torque wiring 120 which is a current flowing in an orthogonal direction to the lamination direction of the magnetoresistance effect element portion 105.

As described above, the current flowing in the lamination direction of the magnetoresistance effect element portion 105 induces an STT. In contrast, the current flowing in the spin-orbit torque wiring 120 induces an SOT. Both the STT and the SOT contribute to magnetization reversal of the first ferromagnetic metal layer 101.

In this manner, when an amount of the current flowing in the lamination direction of the magnetoresistance effect element portion 105 and an amount of the current flowing in the orthogonal direction to the lamination direction are controlled by the two power supplies, a ratio between contributions of the SOT and the STT contributing to the magnetization reversal can be freely controlled.

For example, when a large current cannot flow through a device, control can be performed such that an STT with high energy efficiency for magnetization reversal is mainly used. That is, an amount of current flowing from the first power supply 140 can be increased, and an amount of current flowing from the second power supply 150 can be reduced.

Further, for example, when it is necessary to manufacture a thin device and a reduction in a thickness of the nonmagnetic layer 102 is inevitable, a current flowing through the nonmagnetic layer 102 is required to be reduced. In this case, the amount of current flowing from the first power supply 140 is reduced, the amount of current flowing from the second power supply 150 is increased, and thereby a contribution fraction of SOT is increased.

A known power supply can be used for the first power supply 140 and the second power supply 150.

As described above, according to the magnetoresistance effect element of the present disclosure in a case of a configuration in which the STT method and the SOT method are used in combination, a ratio between contributions of the STT and the SOT can be freely controlled by the amount of current supplied from the first power supply and the second power supply. Therefore, a ratio between contributions of the STT and the SOT can be freely controlled in accordance with a performance required for a device, and thus this can function as a magnetoresistance effect element having a higher general versatility.

(Manufacturing Method)

A manufacturing method of the spin current magnetization rotational element and the magnetoresistance effect element having the same is not particularly limited, and a known method can be used. For example, physical vapor deposition (PVD) methods such as resistance heating deposition, electron beam evaporation, a molecular beam epitaxy (MBE) method, an ion plating method, an ion beam deposition method, or a sputtering method can be used as a film forming method. Alternatively, chemical vapor deposition (CVD) methods such as a thermal CVD method, a photo CVD method, a plasma CVD method, a metal-organic chemical vapor deposition (MOCVD) method, or an atomic layer deposition (ALD) method can also be used. Hereinafter, an example of a manufacturing method of a magnetoresistance effect element to which a spin-orbit torque magnetization reversal element is applied will be described, and this will also serve as description of a manufacturing method of the spin-orbit torque magnetization reversal element.

First, a spin-orbit torque wiring is fabricated on a substrate serving as a support. For example, a spin generation layer and a spin conduction layer may be formed in sequence using a sputtering method. Next, a spin-orbit torque wiring is processed into a predetermined shape using a photolithography technique or the like.

Then, a portion other than the spin-orbit torque wiring is covered with an insulating film such as an oxide film. Alternatively, a surface of the spin-orbit torque wiring may be oxidized or nitrided to form the surface of the spin-orbit torque wiring as an insulating layer or a high-resistance layer. In this case, the surface of the spin-orbit torque wiring at least having high-resistance is covered with an insulating film such as an oxide film. It is preferable to polish an exposed surface of the spin-orbit torque wiring and the insulating film by chemical mechanical polishing (CMP).

Next, a magnetoresistance effect element is fabricated. The magnetoresistance effect element is fabricated using a sputtering method, for example. In a case in which a magnetoresistance effect element is a tunnel magnetoresistive (TMR) element, for example, a tunnel barrier layer is formed on a first ferromagnetic metal layer by first sputtering a metal thin film of about 0.4 to 2.0 nm from which bivalent cations of magnesium, aluminum, and a plurality of nonmagnetic elements are ejected, performing plasma oxidation or natural oxidation by introducing oxygen, and subsequent heat treatment.

It is preferable to perform annealing treatment on the obtained laminated film. The layer formed by reactive sputtering is amorphous and needs to be crystallized. For example, when Co—Fe—B is used as the ferromagnetic metal layer, a portion of B is crystallized by being annealed.

A magnetoresistive ratio improves in the magnetoresistance effect element fabricated by annealing treatment as compared with a magnetoresistance effect element fabricated without annealing treatment. It is thought that this is because uniformity of crystal sizes and an orientation in the tunnel barrier layer of the nonmagnetic layer are improved.

For the annealing treatment, it is preferable that heating be performed in an inert atmosphere such as Ar at a temperature of 300° C. or more and 500° C. or less for 5 minutes or more and 100 minutes or less, and then heating be performed in a state in which a magnetic field of 2 kOe or more and 10 kOe or less is applied at a temperature of 100° C. or more and 500° C. or less for 1 hour or more and 10 hours or less.

As a method of forming the magnetoresistance effect element into a predetermined shape, a processing means such as photolithography can be used. First, the magnetoresistance effect element is laminated, and then a resist is applied on a surface of the magnetoresistance effect element on a side opposite to the spin-orbit torque wiring. Then, a predetermined portion of the resist is cured to remove unnecessary portions of the resist. The portion in which the resist has been cured serves as a protective film of the magnetoresistance effect element. The portion in which the resist has been cured has the same shape as that of a finally obtained magnetoresistance effect element.

Then, a process such as ion milling, reactive ion etching (RIE), or the like is performed on the surface on which the protective film is formed. A portion in which the protective film is not formed is removed, and thereby a magnetoresistance effect element with a predetermined shape is obtained.

The present disclosure is not necessarily limited to the configuration and manufacturing method of the spin-orbit torque magnetization reversal element according to the above embodiments, and various modifications can be added without departing from the gist of the present disclosure.
(Magnetic memory)

Figure 5:
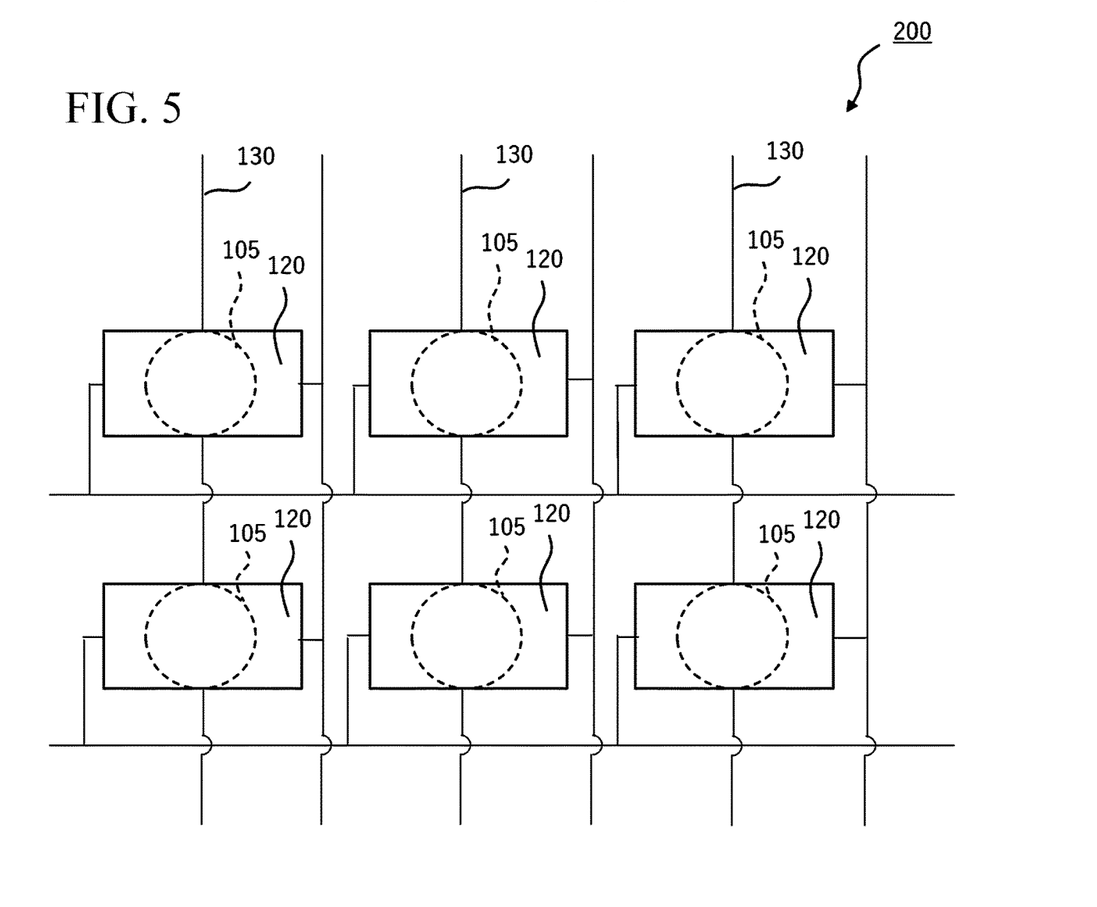
FIG. 5 is a view of a magnetic memory (MRAM) with a plurality of magnetoresistance effect elements according to another embodiment of the present invention.

A magnetic memory (MRAM) 200 of the present invention includes a plurality of magnetoresistance effect elements of the present invention, as illustrated in FIG. 5.
(Magnetization Reversal Method)

A magnetization reversal method in the magnetoresistance effect elements of the present disclosure allows a current density of a current flowing in the spin-orbit torque wiring to be less than $1 \times 10^7$ A/cm$^2$. When a current density of the current flowing in the spin-orbit torque wiring is excessively large, heat is generated due to the current flowing through the spin-orbit torque wiring. When heat is applied to the second ferromagnetic metal layer, magnetization stability of the second ferromagnetic metal layer is lost, and unexpected magnetization reversal or the like may occur. When such an unexpected magnetization reversal occurs, a problem in which recorded information is rewritten occurs. That is, in order to avoid unexpected magnetization reversal, it is preferable that a current density of the current flowing in the spin-orbit torque wiring be not excessively large. When a current density of the current flowing in the spin-orbit torque wiring is less than $1 \times 10^7$ A/cm$^2$, it is possible to avoid occurrence of the magnetization reversal at least due to generated heat.

In the magnetoresistance effect element of the present disclosure, in a case of a configuration in which the STT method and the SOT method are used in combination, the magnetization reversal method may be performed by applying a current to a power supply of the magnetoresistance effect element after applying a current to a power supply of the spin-orbit torque wiring.

The SOT magnetization reversal step and the STT magnetization reversal step may be performed at the same time, or the STT magnetization reversal step may be additionally performed after the SOT magnetization reversal step is performed in advance. A current may be supplied simultaneously from the first power supply 140 and the second power supply 150 or a current may be supplied from the first power supply 140 after a current is supplied from the second power supply 150, but it is preferable to apply a current to the power supply of the magnetoresistance effect element after a current is applied to the power supply of the spin-orbit torque wiring in order to reliably obtain an assistance effect of the magnetization reversal using the SOT. In other words, it is preferable to supply a current from the second power supply 150, and then additionally supply a current from the first power supply 140.

REFERENCE SIGNS LIST

1 First ferromagnetic metal layer
2 Spin-orbit torque wiring

3 Spin conduction layer
4 Spin generation layer
5 Low-resistance electrode
10 Spin current magnetization rotational element
100 Magnetoresistance effect element
101 First ferromagnetic metal layer
102 Nonmagnetic layer
103 Second ferromagnetic metal layer
104 Cap layer
105 Magnetoresistance effect element portion
110 Substrate
120 Spin-orbit torque wiring
130 Wiring
140 First power supply
150 Second power supply
200 Magnetic memory comprising a plurality of magnetoresistance effect elements

The invention claimed is:

1. A spin current magnetization rotational element comprising:
a first ferromagnetic metal layer for a magnetization direction to be changed; and
a spin-orbit torque wiring extending in a second direction intersecting a first direction which is an orthogonal direction to a surface of the first ferromagnetic metal layer and configured to be joined to the first ferromagnetic metal layer, wherein
the spin-orbit torque wiring has a structure in which a spin conduction layer joined to the first ferromagnetic metal layer and a spin generation layer joined to the spin conduction layer on a surface on a side opposite to the first ferromagnetic metal layer are laminated, and
wherein a thickness of the spin-orbit torque wiring is equal to or less than 20 nm.

2. A spin current magnetization rotational element comprising:
a first ferromagnetic metal layer for a magnetization direction to be changed; and
a spin-orbit torque wiring extending in a second direction intersecting a first direction which is an orthogonal direction to a surface of the first ferromagnetic metal layer and configured to be joined to the first ferromagnetic metal layer, wherein
the spin-orbit torque wiring has a structure in which a spin conduction layer joined to the first ferromagnetic metal layer and a spin generation layer joined to the spin conduction layer on a surface on a side opposite to the first ferromagnetic metal layer are laminated, and
a ratio $t1/t2$ of a film thickness $t1$ of the spin conduction layer to a film thickness $t2$ of the spin generation layer is designed to be equal to or less than a ratio $\rho1/\rho2$ of a resistivity $\rho1$ of the spin conduction layer to a resistivity $\rho2$ of the spin generation layer.

3. A spin current magnetization rotational element comprising:
a first ferromagnetic metal layer for a magnetization direction to be changed; and
a spin-orbit torque wiring extending in a second direction intersecting a first direction which is an orthogonal direction to a surface of the first ferromagnetic metal layer and configured to be joined to the first ferromagnetic metal layer, wherein
the spin-orbit torque wiring has a structure in which a spin conduction layer joined to the first ferromagnetic metal layer and a spin generation layer joined to the spin conduction layer on a surface on a side opposite to the first ferromagnetic metal layer are laminated, and
a thickness of the spin conduction layer is a thickness equal to or less than a spin diffusion length of the spin conduction layer.

4. A spin current magnetization rotational element comprising:
a first ferromagnetic metal layer for a magnetization direction to be changed; and
a spin-orbit torque wiring extending in a second direction intersecting a first direction which is an orthogonal direction to a surface of the first ferromagnetic metal layer and configured to be joined to the first ferromagnetic metal layer, wherein
the spin-orbit torque wiring has a structure in which a spin conduction layer joined to the first ferromagnetic metal layer and a spin generation layer joined to the spin conduction layer on a surface on a side opposite to the first ferromagnetic metal layer are laminated, and
the spin conduction layer is formed of a material containing at least any one element of Al, Si, Cu, Ag, Ga, and Ge.

5. The spin current magnetization rotational element according to any one of claims 1, 3 and 4, wherein a ratio $t1/t2$ of a film thickness $t1$ of the spin conduction layer to a film thickness $t2$ of the spin generation layer is designed to be equal to or less than a ratio $\rho1/\rho2$ of a resistivity $\rho1$ of the spin conduction layer to a resistivity $\rho2$ of the spin generation layer.

6. The spin current magnetization rotational element according to claim 1 or 3, wherein the spin conduction layer is formed of a material containing at least any one element of Al, Si, Cu, Ag, Ga, and Ge.

7. The spin current magnetization rotational element according to any one of claims 1 to 4, wherein the spin conduction layer has any one cubic crystal structure of NiAl, RuAl, RhAl, IrAl, and TiNi having symmetry of a space group Pm-3m, or any one cubic crystal structure of AN, TaN, YBi, TiC, and TiN having symmetry of a space group Fm-3m.

8. The spin current magnetization rotational element according to any one of claims 1 to 4, wherein the spin generation layer is formed of a material containing any one element of Mo, Ru, Rh, Pd, Ta, W, Ir, Pt, Au, and Bi.

9. The spin current magnetization rotational element according to claim 4, wherein a thickness of the spin conduction layer is a thickness equal to or less than a spin diffusion length of the spin conduction layer.

10. The spin current magnetization rotational element according to any one of claims 1 to 4, wherein a degree of lattice mismatching between the spin conduction layer and the first ferromagnetic metal layer is within 5%.

11. The spin current magnetization rotational element according to any one of claims 1 to 4, wherein
a low-resistance electrode is provided at both ends of the spin-orbit torque wiring, and
a distance between the low-resistance electrode and a side surface of the first ferromagnetic metal layer facing each other is equal to or less than the spin diffusion length of the spin conduction layer.

12. A magnetoresistance effect element comprising:
the spin current magnetization rotational element according to any one of claims 1 to 4;
a second ferromagnetic metal layer configured for a magnetization direction to be fixed; and
a nonmagnetic material layer sandwiched between the first ferromagnetic metal layer and the second ferromagnetic metal layer.

13. A magnetic memory comprising a plurality of magnetoresistance effect elements according to claim 12.

14. The spin current magnetization rotational element according to claim 3 or 4, wherein a ratio t1/t2 of a film thickness t1 of the spin conduction layer to a film thickness t2 of the spin generation layer is designed to be equal to or less than a ratio ρ1/ρ2 of a resistivity ρ1 of the spin conduction layer to a resistivity ρ2 of the spin generation layer, and
  a thickness of the spin-orbit torque wiring is equal to or less than 20 nm.

15. The spin current magnetization rotational element according to claim 4, wherein a thickness of the spin conduction layer is a thickness equal to or less than a spin diffusion length of the spin conduction layer, and
  a thickness of the spin-orbit torque wiring is equal to or less than 20 nm.

16. The spin current magnetization rotational element according to claim 4, wherein a ratio t1/t2 of a film thickness t1 of the spin conduction layer to a film thickness t2 of the spin generation layer is designed to be equal to or less than a ratio ρ1/ρ2 of a resistivity ρ1 of the spin conduction layer to a resistivity ρ2 of the spin generation layer, and
  a thickness of the spin conduction layer is a thickness equal to or less than a spin diffusion length of the spin conduction layer.

* * * * *